(12) United States Patent
Sanchez-Olea

(10) Patent No.: US 7,185,815 B2
(45) Date of Patent: Mar. 6, 2007

(54) DEVICE FOR CONTROLLING MULTIPLE TYPES OF ELECTROLUMINESCENT DEVICES

(75) Inventor: Jorge Sanchez-Olea, Poway, CA (US)

(73) Assignee: CEYX Technologies, Inc., San Diego, CA (US)

( * ) Notice: Subject to any disclaimer, the term of this patent is extended or adjusted under 35 U.S.C. 154(b) by 0 days.

(21) Appl. No.: 11/397,651

(22) Filed: Apr. 4, 2006

(65) Prior Publication Data

US 2006/0180667 A1   Aug. 17, 2006

Related U.S. Application Data

(63) Continuation-in-part of application No. 10/679,553, filed on Oct. 6, 2003, now abandoned, which is a continuation-in-part of application No. 09/724,692, filed on Nov. 28, 2000, now Pat. No. 6,629,638.

(60) Provisional application No. 60/457,095, filed on Mar. 24, 2003.

(51) Int. Cl.
*G06K 7/10* (2006.01)

(52) U.S. Cl. .................................................. 235/454
(58) Field of Classification Search ............... 235/454, 235/455, 462.01
See application file for complete search history.

(56) References Cited

U.S. PATENT DOCUMENTS

| 4,553,268 | A | * | 11/1985 | Tilly .......................... 398/15 |
| 5,721,579 | A | * | 2/1998 | Ogasawara et al. ......... 347/246 |
| 5,850,370 | A | * | 12/1998 | Stringer et al. ............. 367/128 |
| 6,836,493 | B2 | * | 12/2004 | Mahowald et al. ...... 372/38.01 |
| 2005/0030744 | A1 | * | 2/2005 | Ducharme et al. .......... 362/231 |

* cited by examiner

*Primary Examiner*—Daniel Stcyr
(74) *Attorney, Agent, or Firm*—Charles F. Reidelbach, Jr.

(57) ABSTRACT

A controller for an electroluminescent device includes an internal electroluminescent device system configuration database that includes configuration data stored in the controller for multiple electroluminescent device systems. A processor executes instructions from an application program module stored in the controller to perform a function of the configuration data for an electroluminescent device system selected from the multiple electroluminescent device systems in the internal electroluminescent device system configuration database.

25 Claims, 10 Drawing Sheets

Configuration database 500

| Configuration Parameter Name | Symbol | Value |
|---|---|---|
| Laser Servo Gain | GK | |
| Servo damping coefficient | ALPHA | |
| Measured feedback | MF | |
| Set point for extinction ratio | ER | |
| Overload detector setting | PLMAX | |
| Eye Safety Shutdown Setting | Safety | |
| Threshold detector result | Ibth | |
| Temperature | Ts | |
| Flag for selection of Laser Control program | CM | |
| Scaling factors for drivers | SM, SL, SB | |
| Analog input 1 sensor offset | Y-int1 | |
| Analog input 1 sensor gain | m1 | |
| Temperature coefficient for slope efficiency model | TCOSL | |
| Exponential for threshold equation | E1 | |
| Flag to select type of temperature compensation | F1 | |
| TEC control set point | SPTEC | |
| Wavelength set point | L1 | |
| System resolution | Bits | |
| Reference voltage | Vref | |
| Receiver gain setting | RG | |

DEVICE FOR CONTROLLING MULTIPLE TYPES OF ELECTROLUMINESCENT DEVICES

CROSS-REFERENCE TO RELATED APPLICATIONS

This application is a continuation-in-part of U.S. patent application Ser. No. 10/679,553, filed Oct. 6, 2003, now abandoned, which is a continuation-in-part of U.S. patent application Ser. No. 09/724,692, filed Nov. 28, 2000, now U.S. Pat. No. 6,629,638. This application also claims the benefit of Provisional Application No. 60/457,095, filed Mar. 24, 2003. Each of the above applications is incorporated entirely herein by reference.

BACKGROUND OF THE INVENTION

1. Field of the Invention

The present invention is directed to the operation and control of electroluminescent devices such as lasers, laser diodes, and cold cathode fluorescent lamps. More specifically, but without limitation thereto, the present invention is directed to a controller for an electroluminescent device (ELD) system.

2. Description of Related Art

Many different types of electroluminescent devices (ELD) are used in a variety of applications, for example, in optical transceivers used for fiberoptic communications systems and in backlighting panels for liquid crystal displays. Each type of electroluminescent device requires, for example, a power source to drive the ELD and a light output monitor to measure the optical power output of the ELD. Depending on the type of ELD, several parameters may be measured and set to effect the desired operation of an electroluminescent device such as a laser. An example of a measured parameter is optical power output. An example of a set parameter is Optical Modulation Amplitude (OMA). The set parameters are typically hard-coded in firmware. Alternatively, the set parameters may be manually controlled interactively by a user to find and maintain the desired value of the measured parameters. For example, the user may adjust the OMA until a desired Extinction Ratio is measured.

SUMMARY OF THE INVENTION

In one embodiment, a controller for an electroluminescent device includes:
an internal electroluminescent device system configuration database comprising configuration data stored in the controller for multiple electroluminescent device systems; and
a processor for executing instructions from an application program module stored in the controller to perform a function of the configuration data for an electroluminescent device system selected from the multiple electroluminescent device systems in the internal electroluminescent device system configuration database.

In another embodiment, a computer program product includes:
a medium for embodying a computer program for input to a computer; and
a computer program embodied in the medium for causing the computer to perform steps of:
receiving as input configuration data for an electroluminescent device system selected from an internal electroluminescent device system configuration database stored in a controller for multiple electroluminescent device systems;
selecting an application program module stored in the controller as a function of the configuration data for the selected electroluminescent device system; and
performing a function of the configuration data for the selected electroluminescent device system in the application program module.

BRIEF DESCRIPTION OF THE DRAWINGS

The above and other aspects, features and advantages will become more apparent from the description in conjunction with the following drawings presented by way of example and not limitation, wherein like references indicate similar elements throughout the several views of the drawings, and wherein.

Elements in the figures are illustrated for simplicity and clarity and have not necessarily been drawn to scale. For example, the dimensions, sizing, and/or relative placement of some of the elements in the figures may be exaggerated relative to other elements to clarify distinctive features of the illustrated embodiments. Also, common but well-understood elements that may be useful or necessary in a commercially feasible embodiment are often not depicted in order to facilitate a less obstructed view of the illustrated embodiments.

DESCRIPTION OF THE ILLUSTRATED EMBODIMENTS

The following description is not to be taken in a limiting sense, rather for the purpose of describing by specific examples the general principles that are incorporated into the illustrated embodiments. For example, certain actions or steps may be described or depicted in a specific order to be performed. However, practitioners of the art will understand that the specific order is only given by way of example and that the specific order does not exclude performing the described steps in another order to achieve substantially the same result. Also, the terms and expressions used in the description have the ordinary meanings accorded to such terms and expressions in the corresponding respective areas of inquiry and study except where other meanings have been specifically set forth herein.

For each type of electroluminescent device (ELD), a dedicated controller circuit is typically developed, designed, and manufactured for operating and controlling the ELD. Each ELD has its own characteristic parameters that are accommodated by the controller.

Figure 1:
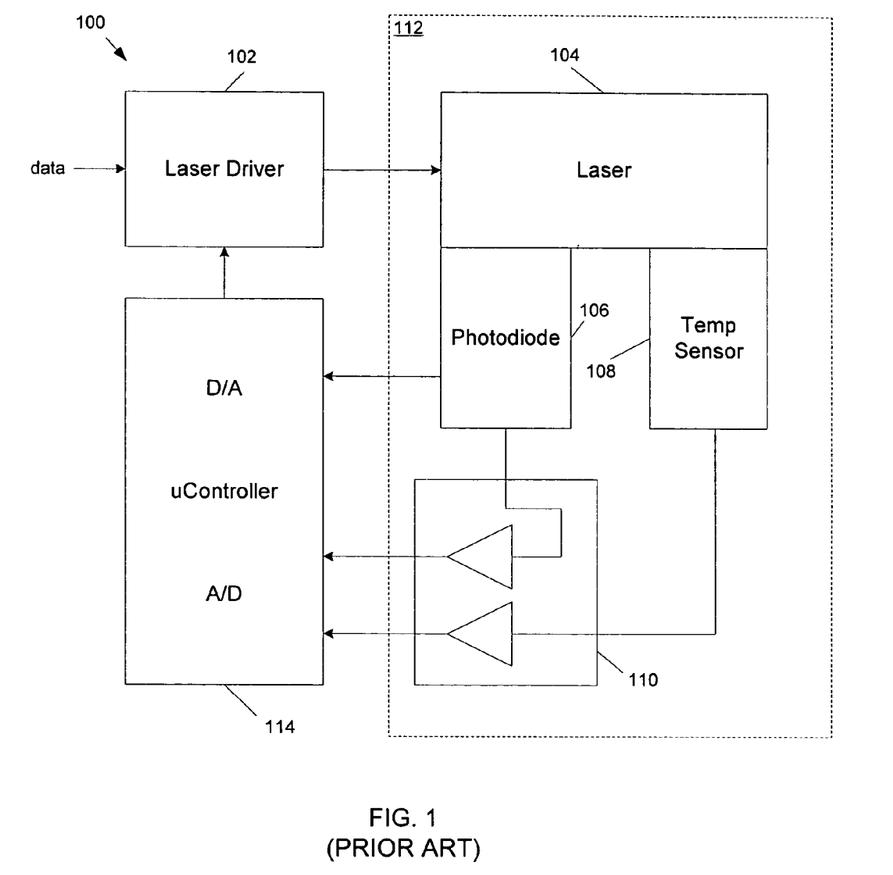
FIG. 1 illustrates a block diagram of a controller for a laser according to the prior art.

FIG. 1 illustrates a block diagram 100 of a controller for a laser according to the prior art. Shown in FIG. 1 are a laser driver 102, a laser 104, a photodiode 106, a temperature sensor 108, an amplifier 110, an electroluminescent device (ELD) system 112, and a micro-controller 114.

In FIG. 1, the laser driver 102 receives a data signal for modulating the laser 104. The laser driver 102 generates a modulated current that drives the laser 104 in the electroluminescent device (ELD) system 112. The photodiode 106 measures the light output from the laser 104 and generates a corresponding proportional electrical signal. The temperature sensor 108 measures the temperature of the laser 104 and generates a corresponding proportional electrical signal. The electrical signals from the photodiode 106 and the temperature sensor 108 are amplified by the amplifier 110 and converted to a digital signal by an analog-to-digital converter in the micro-controller 114. The micro-controller 114 compares the digital signal from the photodiode 106 to a pre-defined value corresponding to the nominal output power of the laser and updates the value of the drive current up or down in value to adjust the laser output power to the nominal output power. The updated value of the drive current is converted to a control voltage by a digital-to-analog converter in the micro-controller 114. The laser driver 102 increases or decreases the drive current to the laser 102 in response to the control voltage. If the laser temperature exceeds a pre-defined value, the micro-controller 114 shuts down the ELD system 112 to prevent damage to the laser 104.

A disadvantage of the arrangement of FIG. 1 is that the computer program in the micro-controller 114 generally has to be redesigned, re-programmed, and rebuilt for each type of laser and even more so for each different type of ELD system 112, resulting in costly project delays and prolonged turnaround time to market.

The disadvantages of the micro-controller 114 of FIG. 1 may be avoided by a reconfigurable controller that can adapt to a wide variety of ELD systems without requiring a new controller design for each different ELD system. Also, the reconfigurable controller may include an expert agent for performing complex functions such as electroluminescent device calibration and servo functions as described below.

In one embodiment, a controller for an electroluminescent device includes:
an internal electroluminescent device system configuration database comprising configuration data stored in the controller for multiple electroluminescent device systems; and
a processor for executing instructions from an application program module stored in the controller to perform a function of the configuration data for an electroluminescent device system selected from the multiple electroluminescent device systems in the internal electroluminescent device system configuration database.

Figure 2:
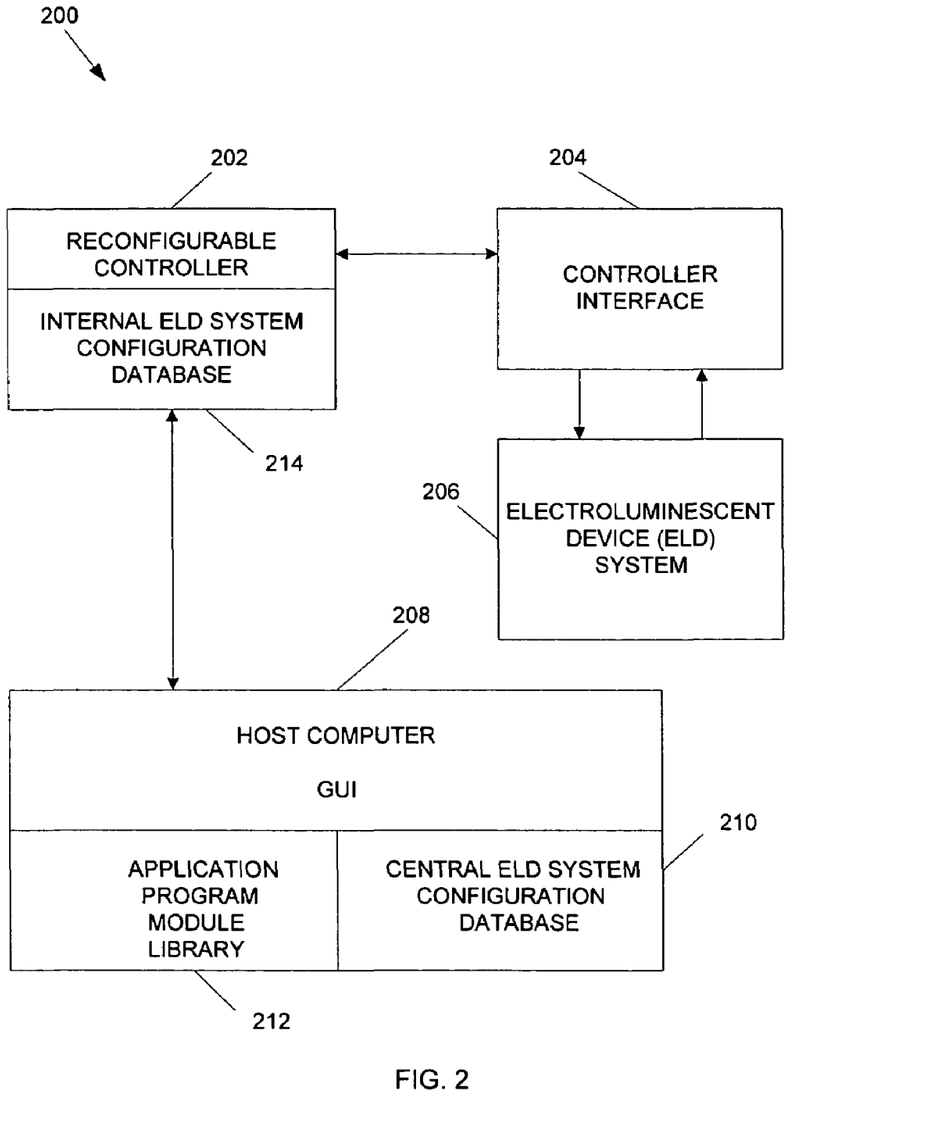
FIG. 2 illustrates a block diagram of a reconfigurable controller for multiple electroluminescent device (ELD) systems.

FIG. 2 illustrates a block diagram 200 of a reconfigurable controller for the electroluminescent device (ELD) system of FIG. 1. Shown in FIG. 2 are a reconfigurable controller 202, a controller interface 204, an electroluminescent (ELD) system 206, a host computer 208, a central ELD system configuration database 210, a program module library 212, and an internal ELD system configuration database 214.

In FIG. 2, the electroluminescent (ELD) system 206 includes an ELD and associated power devices for providing power to the ELD and sensor devices for measuring the ELD light power output and other parameters, such as temperature. The reconfigurable controller 202 includes the internal ELD system configuration database 214, which contains configuration data for multiple ELD systems. The configuration data includes set parameters that are specific to the ELD system 206 such as the nominal drive current, the maximum allowed drive current, the maximum allowed temperature of the ELD, laser set points, scaling factors for analog-to-digital converters (ADC) and digital-to-analog converters (DAC), and calibration parameters.

In one embodiment, the internal ELD system configuration database 214 is downloaded into the reconfigurable controller 202 from the central ELD system configuration database 210 in the host computer 208 when the reconfigurable controller 202 is put in service and periodically thereafter for maintenance. Once the internal ELD system configuration database 214 is loaded into the reconfigurable controller 202, the reconfigurable controller 202 operates independently from the central ELD system configuration database 210 in the host computer 208, even when used with ELD systems other than the ELD system 206.

The reconfigurable controller 202 performs a sequence of desired operations on the ELD system 206 as a function of the configuration data for the selected ELD system 206 and optionally from user input via a graphical user interface (GUI) in the host computer 208. In one embodiment, the reconfigurable controller 202 sends the results of the operations to the host computer 208. For example, if the configuration data for the selected ELD system 206 may indicate that the selected ELD system 206 has not yet been calibrated.

The controller interface 204 passes the set parameters from the reconfigurable controller 202 to the ELD system 206 and the measured parameters from the ELD system 206 to the reconfigurable controller 202.

The ELD system 206 may be, for example, a commercially available optical transceiver used for fiberoptic communications, a liquid crystal backlight system, or any other device used to emit light in response to an electrical stimulus. A wide variety of ELD systems for lasers, laser diodes, cold cathode fluorescent lamps, and other electroluminescent devices are commercially available, and other ELD systems made for a variety of applications may also be used to practice various embodiments within the scope of the appended claims. The ELD system 206 typically includes driver devices for supplying power to an ELD and sensor devices for measuring parameters such as optical power output, drive current, ELD wavelength, and ELD temperature.

The controller interface 204 includes typical input/output (I/O) circuitry, analog-to-digital converters (ADC), and digital-to-analog converters (DAC) for interfacing one or more digital I/O ports in the reconfigurable controller 202 to analog and/or digital ports in the ELD system 206. The reconfigurable controller 202 and the controller interface 204 may be, for example, integrated into the same circuit, or they may be separate circuits each equipped with standard connectors for connecting to each other and the ELD system 206 by electrical cables. In another embodiment, the controller interface 204 is integrated with the ELD system 206 to provide a standard data communications interface that is compatible with the reconfigurable controller 202. In a further embodiment, the reconfigurable controller 202, the controller interface 204, and the ELD system 206 components are mounted on a single circuit board, for example, by soldering the components to the circuit board.

The host computer 208 may be, for example, a personal computer (PC) such as a desktop or notebook computer. The host computer 208 includes a display, a user data entry device such as a mouse and/or keyboard and an I/O port for communicating information between the user and the reconfigurable controller 202 according to well-known techniques, for example, via a graphical user interface (GUI) in the host computer 208. The host computer 208 also includes internal or external storage media such as a disk drive for storing the program module library 212 and the central ELD system configuration database 210.

The central ELD system configuration database 210 includes configuration data for multiple electroluminescent device (ELD) systems and values for the set parameters that are specific to each ELD system. Each ELD system typically has different configuration data and values for the set parameters that are specific to each type of ELD and even to different models of the same type of ELD. Examples of data in the configuration database 210 include parameters for equations that are computed by the reconfigurable controller 202, maximum and nominal values of drive current for lasers, and firing voltages for various models of fluorescent lamps. The information for constructing the central ELD system configuration database 210 may be obtained, for example, from various manufacturers of ELD systems.

The application program module library 212 includes a set of application program modules that may be used to perform a variety of functions with the reconfigurable controller 202 for the electroluminescent device system 206. The application program modules may be compiled and maintained on the host computer 208, for example, by ELD design engineers. In one embodiment, the application program modules are downloaded from the application program module library 212 in the host computer 208 to the reconfigurable controller 202 when the reconfigurable controller 202 is put in service and periodically thereafter for maintenance. Once the application program modules are loaded into the reconfigurable controller 202, the reconfigurable controller 202 executes instructions from the application program modules stored in the reconfigurable controller 202 independently from the host computer 208, even when used with ELD systems other than the ELD system 206.

Figure 3:
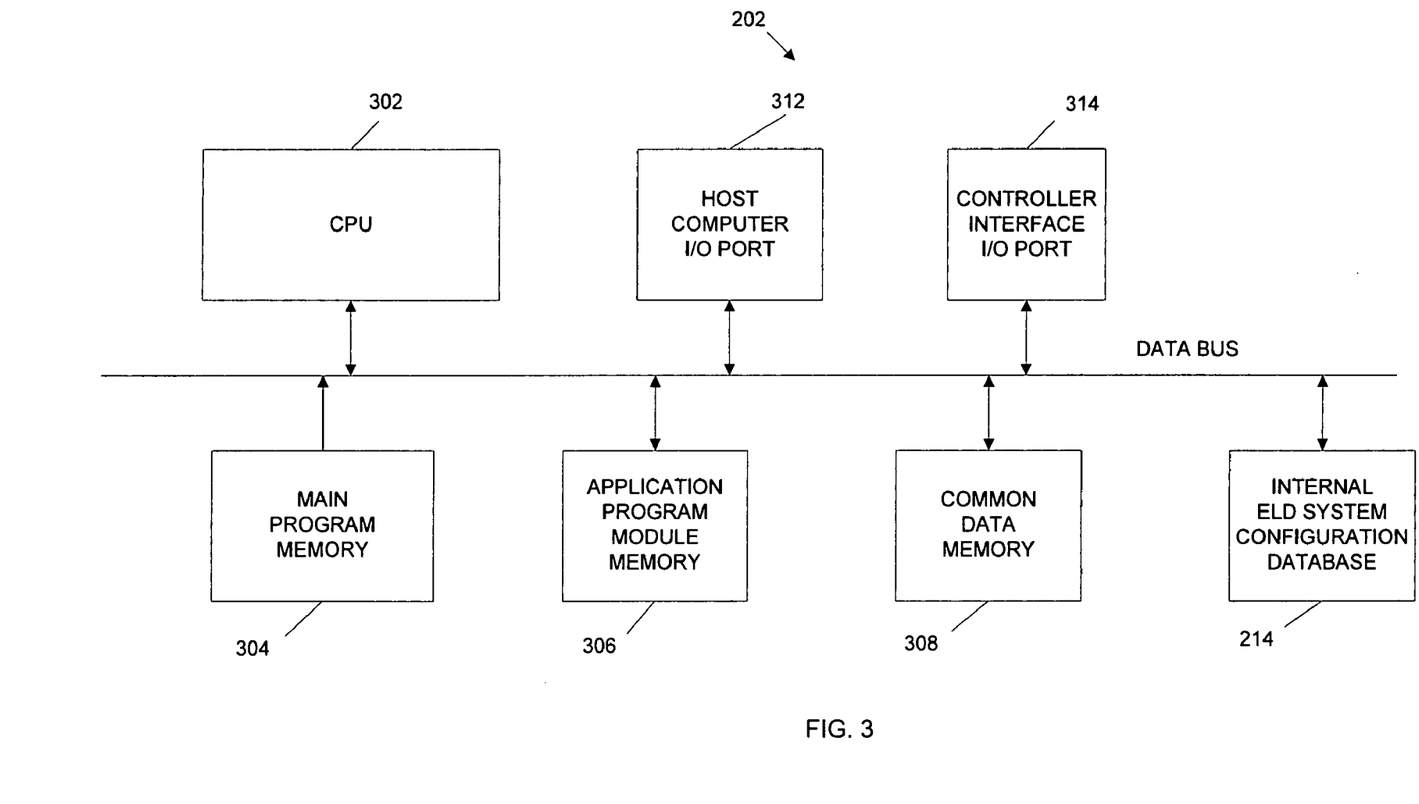
FIG. 3 illustrates a detailed block diagram of the reconfigurable controller of FIG. 2.

FIG. 3 illustrates a detailed block diagram of the reconfigurable controller 202 of FIG. 2. Shown in FIG. 3 are a central processing unit (CPU) 302, a main program memory 304, an application program module memory 306, a common data memory 308, an internal ELD configuration database 214, a host computer I/O port 312, and a controller interface I/O port 314.

In FIG. 3, the central processing unit (CPU) 302 may be, for example, a microprocessor or other circuit capable of executing instructions from a computer program. The main program memory 304 may be, for example, a flash memory for holding the main program module executed by the reconfigurable controller 202. The program module memory 306 may be, for example, a flash memory for holding the program code for a set of application program modules that are selected and downloaded from the host computer 208. The common data memory 308 may be, for example, random-access memory (RAM) for storing and retrieving inputs and outputs for the application program modules, including intermediate computations that are generated by the application program modules.

The application program module memory 306, the common data memory 308, and the internal ELD configuration database 214 may be physically separate devices as shown in FIG. 3. In other embodiments, the program module memory 306, the common data memory 308, and the internal ELD configuration database 214 may each occupy a separate address range on the same memory device.

The host computer I/O port 312 may be, for example, an RS-232 port or an I2C port for connecting the reconfigurable controller 202 to the host computer 208 in FIG. 2. The controller interface I/O port 314 may be, for example, one or more parallel and/or serial I/O ports.

In one embodiment, a user selects an ELD system, for example, from a list displayed on a graphical user interface (GUI) in the host computer 208 and selects an operation, for example, calibration, to be performed on the ELD system. The host computer 208 sends the identifying information for the selected ELD system and the operation request to the reconfigurable controller 202 via the host computer I/O port 312. In another embodiment, the reconfigurable controller 202 operates standalone without the host computer 208, even when the ELD system 206 is replaced with a different ELD system. As long as the configuration data for the ELD system is included in the internal ELD configuration database 214, the reconfigurable controller 202 can reconfigure itself for different ELD systems without user input and without the host computer 208.

The main program module executed by the CPU 302 from the main program memory 304 executes the application program modules needed to perform a desired function of the configuration data for the ELD system 206 stored in the internal ELD configuration database 214. For example, the configuration data for a certain model of a laser system may include specific values for parameters A, B, and C that are inputs for an equation in an application program module for calibration. For some operations, only one application program module may be required; other more complex operations may require several application program modules. Because the configuration data for the ELD system is pre-loaded in the internal ELD configuration database 214, delays and errors that may result from a user's lack of knowledge of the ELD system parameters may be advantageously avoided.

The reconfigurable controller 202 may operate independently of the host computer 208, and the host computer 208 may be disconnected from the reconfigurable controller 202 if no further communication with the user via the graphical user interface (GUI) is desired. The reconfigurable controller 202 invokes the application program modules in the appropriate sequence under the direction of the main program module according to the configuration data stored in the internal ELD configuration database 214 for any ELD system that is included in the internal ELD configuration database 214.

Each of the application program modules in the reconfigurable controller 202 receives input parameter values from the internal ELD configuration database 214 and/or the common data memory 308. The common data memory 308 may also store intermediate computations and results generated by the application program modules. The common data memory 308 advantageously allows communication of intermediate computations and results among the application program modules outside the application program module memory 306, so that data generated by the application program modules may be managed and monitored more efficiently than in an arrangement in which the application program modules communicate with one another through variables that may be inconveniently scattered throughout the application program module code. For example, different application program modules for temperature compensation and servo control can communicate values for bias current and modulation current between each other using the same locations in the common data memory 308 and/or the ELD configuration database 214. This feature avoids having to coordinate the exchange of variables between the application program modules each time the reconfigurable controller 202 is reconfigured with a different set of application program modules.

When the application program modules have completed their computations, the main program module can transfer the results from the common data memory 308 and/or the internal ELD configuration database 214 to the host computer I/O port 312, for example, to display to the user via a GUI in the host computer 208.

As may be appreciated from FIG. 3, the reconfigurable controller 202 may be reconfigured for each ELD system in the internal ELD configuration database 214 without replacing the controller hardware or manually reprogramming the controller software. Also, updates to the application program modules may be performed as needed in the host computer 208 and stored in the application program module library 212. The application program modules may be downloaded into the application program module memory 306 periodically, ensuring that the reconfigurable controller 202 always uses the most current version of each application program module.

Once the application program modules have been downloaded into the application program module memory 306 from the host computer 208, the reconfigurable controller 202 executes the application program modules independently from the host computer 208. Unless communication with the user via a GUI is desired, the host computer 208 may be disconnected from the reconfigurable controller 202 to perform the functions described in the following examples of application program modules.

Figure 4:
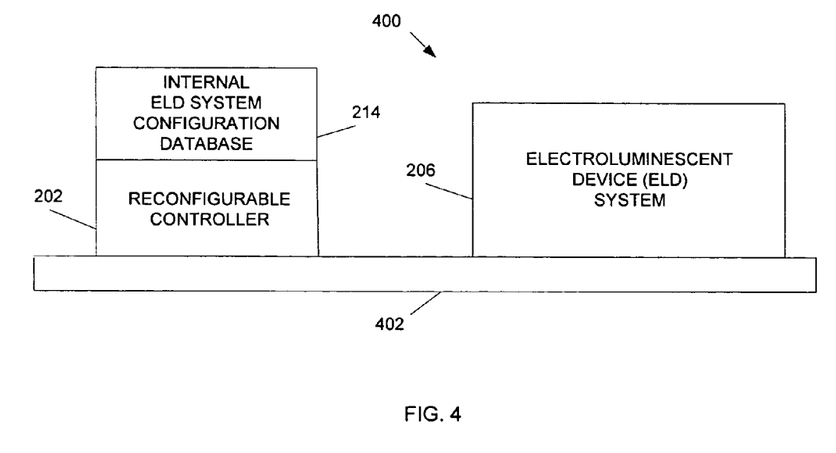
FIG. 4 illustrates a side view of the reconfigurable controller of FIG. 3 and an electroluminescent device (ELD) system mounted on the same circuit board.

FIG. 4 illustrates a side view 400 of the reconfigurable controller 202 of FIG. 3 and an electroluminescent device (ELD) system mounted on the same circuit board. Shown in FIG. 4 are a reconfigurable controller 202, an ELD system 206, and a printed circuit board 402.

In FIG. 4, the reconfigurable controller 202 and the ELD system 206 are soldered onto the printed circuit board 402. The printed circuit board 402 provides mechanical support and electrical connections between the reconfigurable controller 202 and the ELD system 206. In this embodiment, the controller interface 204 in FIG. 3 is incorporated into the ELD system 206. When the ELD system 206 is replaced due to failure or upgrade, the reconfigurable controller 202 can automatically reconfigure itself to operate with the replacement ELD system without direction from a user or a host computer, as long as the configuration data for the replacement ELD system is included in the internal ELD configuration database 214 stored in the reconfigurable controller 202.

The flow charts for the main program module and the application program modules described below may be embodied in a disk, a CD-ROM, and other computer readable media according to well-known computer programming techniques.

In another embodiment, a computer program product includes:

a medium for embodying a computer program for input to a computer; and a computer program embodied in the medium for causing the computer to perform steps of:

a computer program embodied in the medium for causing the computer to perform steps of:

receiving as input configuration data for an electroluminescent device system selected from an internal electroluminescent device system configuration database stored in a controller for multiple electroluminescent device systems;

selecting an application program module stored in the controller as a function of the configuration data for the selected electroluminescent device system; and performing a function of the configuration data for the selected electroluminescent device system in the application program module.

Figure 5:
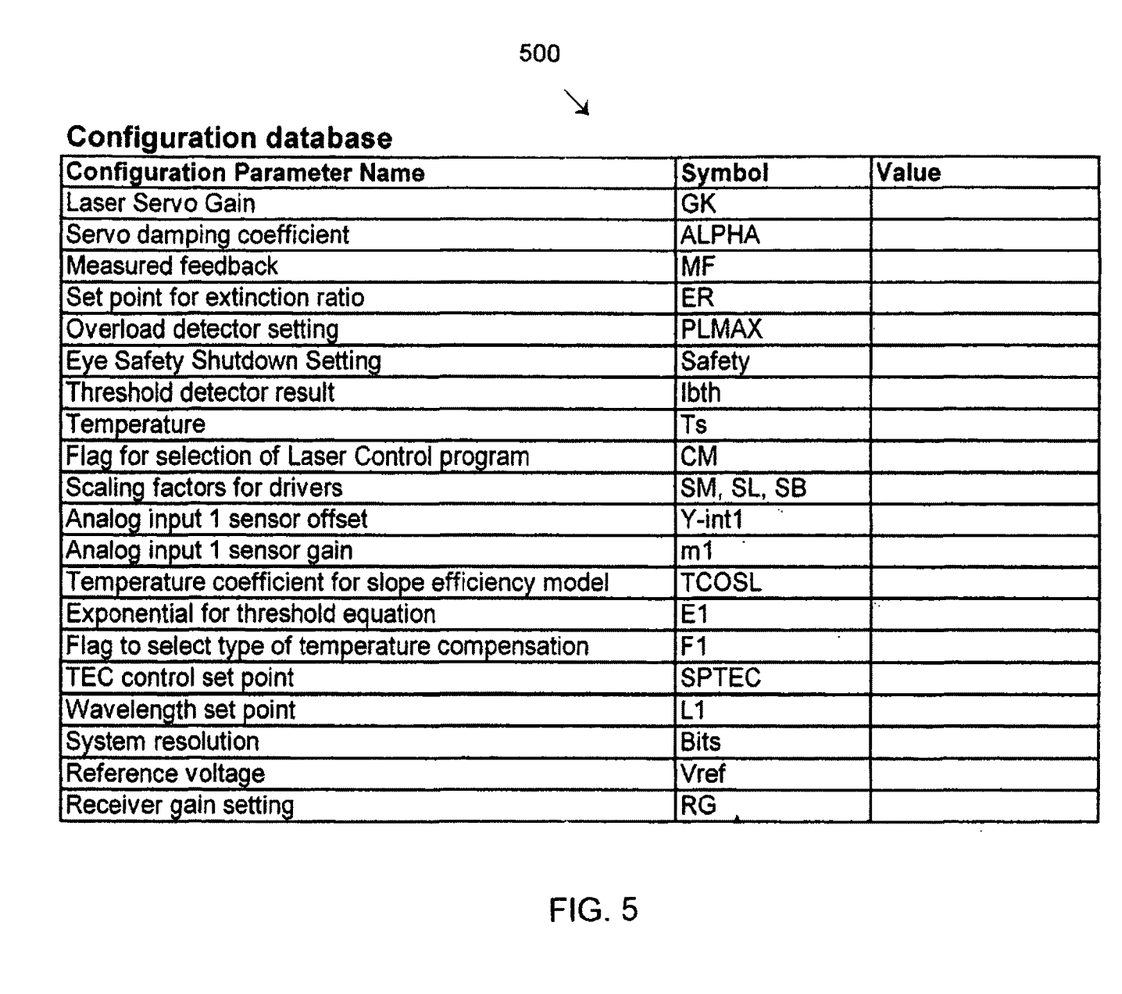
FIG. 5 illustrates a table of a portion of the internal ELD configuration database stored in the reconfigurable controller of FIG. 3.

FIG. 5 illustrates a table 500 of a portion of the internal ELD configuration database that constitutes the ELD configuration data in the reconfigurable controller 202 of FIG. 3. Each parameter entry in the ELD configuration data includes a description of the parameter, a symbol that may be used to identify the parameter in the application program modules, and a value of the parameter (not shown) that is appropriate for the specific ELD system 206 connected to the reconfigurable controller 202 in FIG. 2.

Figure 6:
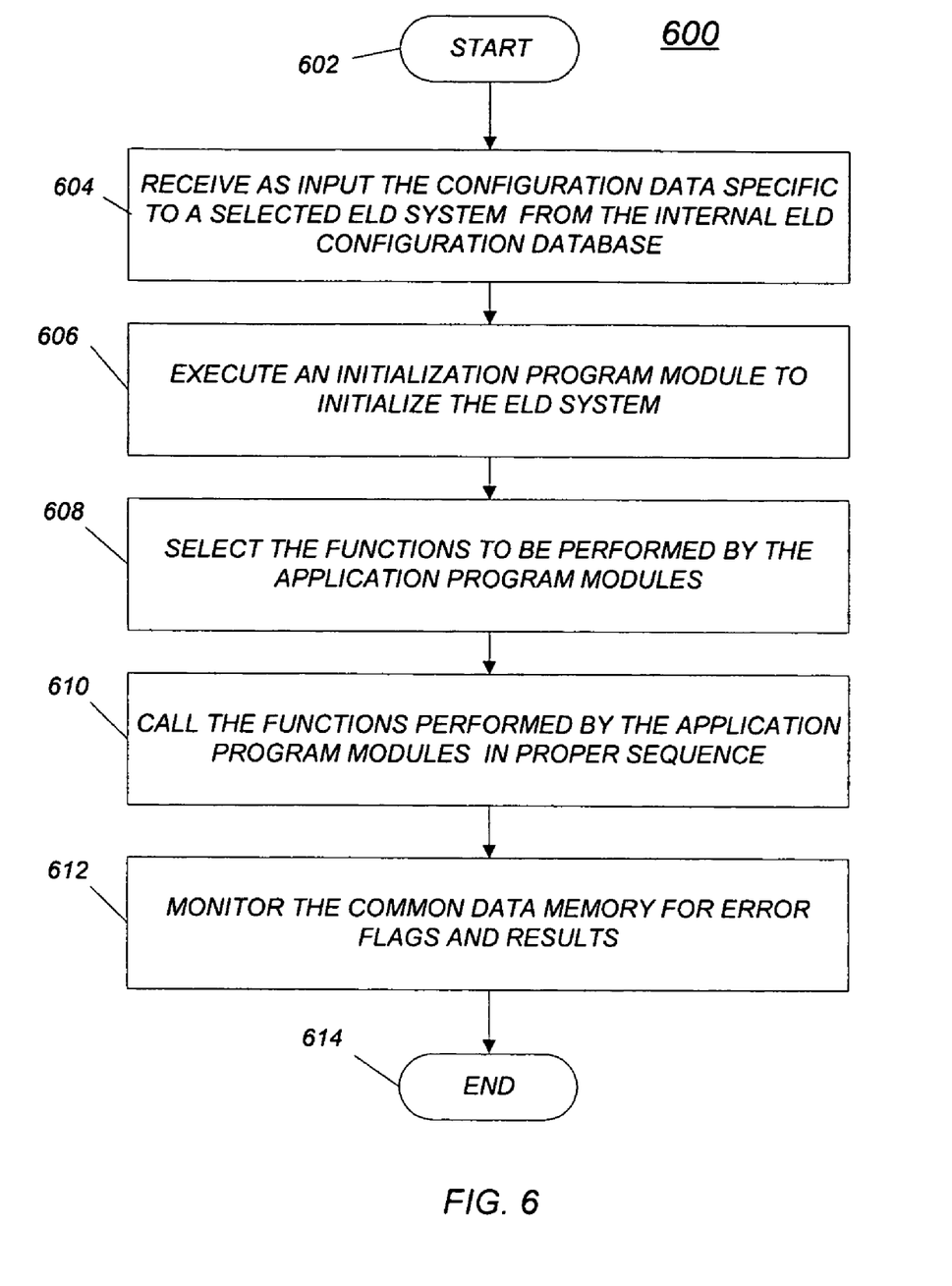
FIG. 6 illustrates a flow chart of a main program module for the reconfigurable controller of FIG. 3.

FIG. 6 illustrates a flow chart 600 of a main program module for the reconfigurable controller 202 of FIG. 3.

Step 602 is the entry point of the flow chart 600.

In step 604, the reconfigurable controller 202 receives as input the configuration data specific to a selected ELD system from the internal ELD configuration database 214. In another embodiment, the ELD system is selected by the user at the host computer 208 from a GUI in the host computer 208 and downloaded to the reconfigurable controller 202. In a further embodiment, the ELD system may identify itself to the reconfigurable controller 202, for example, by a digital ID code.

In step 606, the reconfigurable controller 202 executes an initialization program module to initialize the ELD system. In one embodiment, the initialization program module is included in the main program module. In another embodiment, the reconfigurable controller 202 identifies the initialization program module from the ELD system configuration data and selects the initialization program module from the application program module memory 306. In a further embodiment, the reconfigurable controller 202 downloads the initialization program module into the application program module memory 306 from the host computer 208.

In an embodiment for a laser ELD, the reconfigurable controller 202 loads all zeroes into the bias and modulation digital-to-analog converters (DACs) to protect the laser from overload and reads the photodiode response value to set the value of the dark current.

In step 608, the reconfigurable controller 202 selects the functions to be performed by the application program modules, for example, from flags and other information included in the ELD system configuration data. For example, a temperature compensation function may have to be performed before a servo function is performed.

In step 610, the reconfigurable controller 202 calls the functions performed by the application program modules in proper sequence.

In step 612, the reconfigurable controller 202 monitors the common data memory 308, for example, for error flags and results to send to the host computer 208. In one embodiment, the reconfigurable controller 202 executes interrupt routines for automatic eye safety and programmable eye safety shutdown procedures. In another embodiment, the interrupt routines are included in an application program module such as an initialization program module.

Step 614 is the exit point of the flow chart 600.

Figure 7:
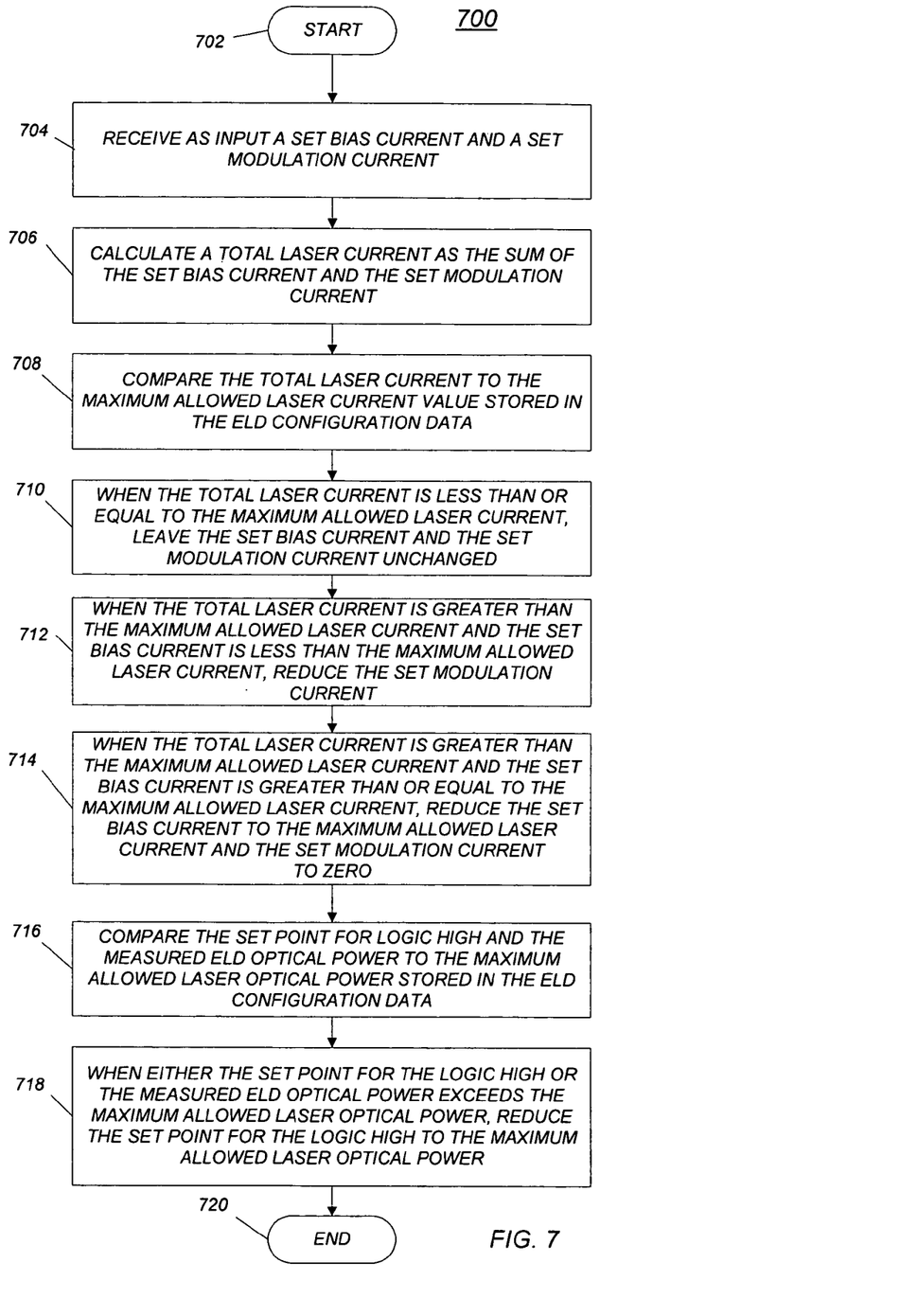
FIG. 7 illustrates a flow chart of an application program module for detecting laser overload for the reconfigurable controller of FIG. 3.

FIG. 7 illustrates a flow chart 700 of an application program module for detecting laser overload for the reconfigurable controller 202 of FIG. 3.

Step 702 is the entry point of the flow chart 700.

In step 704, the reconfigurable controller 202 receives as input a set bias current and a set modulation current from the ELD configuration data.

In step 706, the reconfigurable controller 202 calculates a total laser current as the sum of the set bias current and the set modulation current.

In step 708, the reconfigurable controller 202 compares the total laser current to the maximum allowed laser current value stored in the ELD configuration data.

In step 710, when the total laser current is less than or equal to the maximum allowed laser current, the reconfigurable controller 202 leaves the set bias current and the set modulation current unchanged.

In step 712, when the total laser current is greater than the maximum allowed laser current and the set bias current is less than the maximum allowed laser current, the reconfigurable controller 202 reduces the set modulation current to the difference between the maximum allowed laser current and the set bias current. A current overload flag is also set in the common data memory 308 and/or the ELD configuration data.

In step 714, when the total laser current is greater than the maximum allowed laser current and the set bias current is greater than or equal to the maximum allowed laser current, the reconfigurable controller 202 reduces the set bias current to the maximum allowed laser current. The reconfigurable controller 202 reduces the set modulation current to zero and sets the current overload flag in the common data memory 308 and/or the ELD configuration data.

In step 716, the reconfigurable controller 202 compares the set point for logic high and the measured ELD optical power to the maximum allowed laser optical power stored in the ELD configuration data.

In step 718, when either the set point for the logic high or the measured ELD optical power exceeds the maximum allowed laser optical power, then the reconfigurable controller 202 reduces the set point for the logic high to the maximum allowed laser optical power. The reconfigurable controller 202 also sets a power overload flag in the common data memory 308 and/or the ELD configuration data.

Step 720 is the exit point of the flow chart 700.

Figure 8:
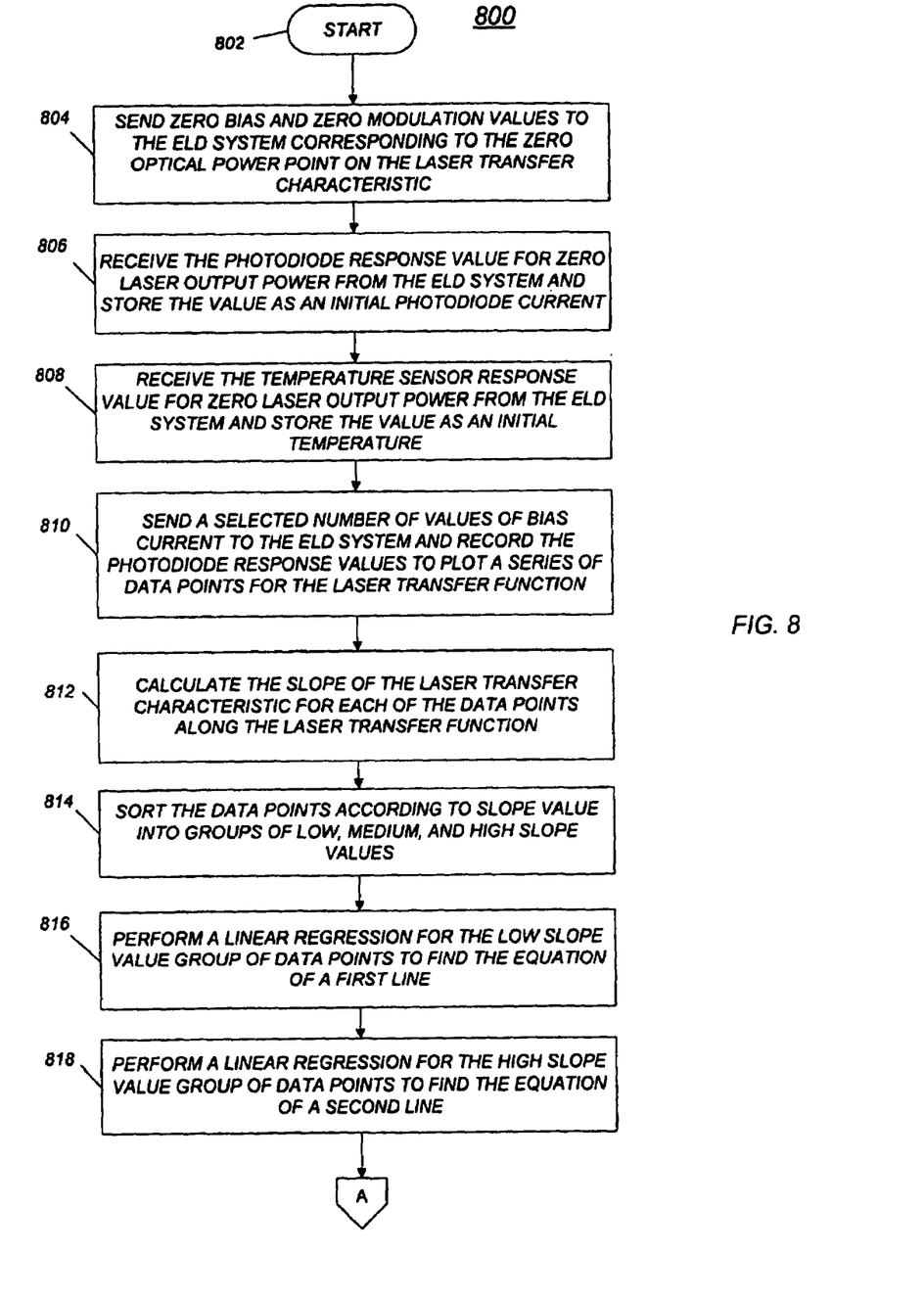
FIG. 8 illustrates a flow chart of an application program module for finding a laser threshold of an ELD system for the reconfigurable controller of FIG. 3.

FIG. 8 illustrates a flow chart 800 of an application program module for finding a laser threshold of an ELD system for the reconfigurable controller 202 of FIG. 3.

Step 802 is the entry point for the flow chart 800.

In step 804, the reconfigurable controller 202 sends zero bias and zero modulation values to the ELD system corresponding to the zero optical power point on the laser transfer characteristic.

In step 806, the reconfigurable controller 202 receives the photodiode response value for zero laser output power from the ELD system and stores the value as an initial photodiode current.

In step 808, the reconfigurable controller 202 receives the temperature sensor response value for zero laser output power from the ELD system and stores the value as an initial temperature.

In step 810, the reconfigurable controller 202 sends a selected number of values of bias current to the ELD system and records the photodiode response values to plot a series of data points for the laser transfer function. By automating the measurement with the reconfigurable controller 202, the data points may be measured, for example, over a time period of about 100 milliseconds.

In step 812, the reconfigurable controller 202 calculates the slope of the laser transfer function for each of the data points along the laser transfer function according to well-known techniques.

In step 814, the reconfigurable controller 202 sorts the data points according to slope value into groups of low, medium, and high slope values.

In step 816, the reconfigurable controller 202 performs a linear regression for the low slope value group of data points according to well-known techniques to find the equation of a first line.

In step 816, the reconfigurable controller 202 performs a linear regression for the high slope value group of data points to find the equation of a second line.

In step 818, the reconfigurable controller 202 calculates the intersection point of the first and second lines and stores the value as the laser threshold current and the laser threshold power output. The slope of the second line defines the slope efficiency.

In step 820, the reconfigurable controller 202 sends the threshold current value to the ELD system to drive the laser at the threshold power output level.

In step 822, the reconfigurable controller 202 receives the temperature sensor response value from the ELD system and stores the value as the threshold temperature.

In step 824, the reconfigurable controller 202 generates as output the threshold current, the threshold power output, the initial temperature, the threshold temperature, and the slope efficiency. In another embodiment, the reconfigurable controller 202 sends the data points measured for the laser transfer characteristic to the host computer 208 for displaying to a user via a graphical user interface (GUI) in the host computer 208.

Step 826 is the exit point for the flow chart 800.

Figure 9:
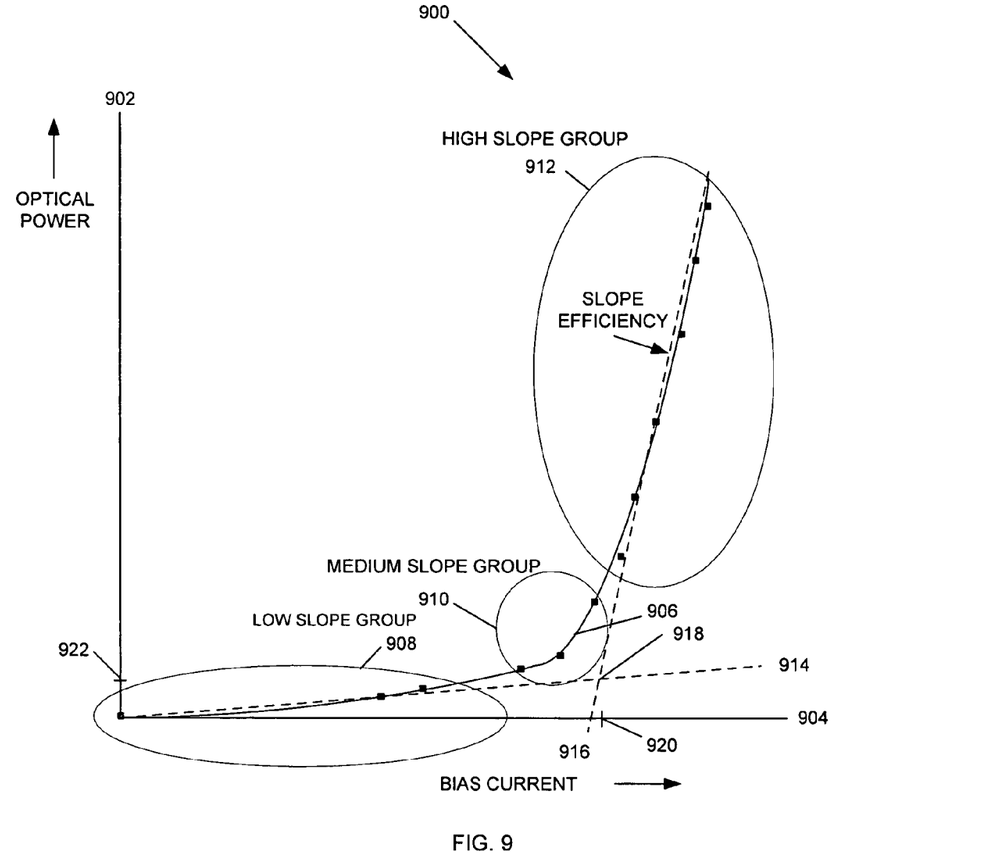
FIG. 9 illustrates a plot of a laser transfer characteristic and a laser threshold generated as output from the application program module of FIG. 8.

FIG. 9 illustrates a plot 900 of a laser transfer function and a laser threshold generated as output from the application program module of FIG. 8. Shown in FIG. 9 are a laser optical power axis 902, a bias current axis 904, a laser transfer function 906, data point groups 908, 910, and 912, a first line L1 914, a second line L2 916, an intersection point 918, a threshold current value 920, and a threshold optical power output 922.

In FIG. 9, the reconfigurable controller 202 records the data points 908, 910, and 912 in the function space defined by the laser output power axis 902 and the bias current axis 904 are recorded for the ELD system as described in the flow chart of FIG. 8. The reconfigurable controller 202 sorts the data points into the low slope data point group 908, the medium slope data point group 910, and the high slope data point group 912. The data points in the low slope data point group 908 and the high slope data point group 912 may be determined, for example, by comparing the slope of each data point with the slope of the previous data point and terminating the group when the difference in slope exceeds a selected threshold, for example, 10 percent.

The equation of the first line L1 914 is found by performing a linear regression on the data points in the low slope data point group 908. The equation of the second line L2 916 is found by performing a linear regression on the data points in the high slope data point group 912. The intersection point of the lines L1 and L2 defines the threshold current value 920 and the threshold power output 922. The slope of the line L2 defines the slope efficiency.

Although the flowchart descriptions above are described and shown with reference to specific steps performed in a specific order, these steps may be combined, sub-divided, or reordered without departing from the scope of the claims. Unless specifically indicated, the order and grouping of steps is not a limitation of other embodiments that may lie within the scope of the claims.

The specific embodiments and applications thereof described above are for illustrative purposes only and do not preclude modifications and variations that may be made within the scope of the following claims.

What is claimed is:

1. A controller for an electroluminescent device comprising:
   an internal electroluminescent device system configuration database comprising configuration data stored in the controller for multiple electroluminescent device systems;
   a processor for executing instructions from an application program module stored in the controller to perform a function of the configuration data for an electroluminescent device system selected from the multiple electroluminescent device systems in the internal electroluminescent device system configuration database;
   a host computer; and
   a graphical user interface in the host computer for communicating information between a user and the controller, the function of the configuration data performed independently from the host computer when the host computer is disconnected from the controller.

2. The controller of claim 1 further comprising an application program module memory in the controller for storing the application program module.

3. The controller of claim 2 further comprising a common data memory in the controller for storing outputs from the application program module outside the application program module memory.

4. The controller of claim 2 further comprising a main program module for determining when to execute the application program module.

5. The controller of claim 4 further comprising a function in the main program module for downloading the application program module from the host computer to the application program module memory.

6. The controller of claim 4 further comprising a function in the main program module for sending results generated as output from the application program module to the host computer.

7. The controller of claim 1 further comprising a host computer I/O port for coupling the controller to the host computer.

8. The controller of claim 1 further comprising a central electroluminescent device system configuration database for multiple electroluminescent device systems stored in the host computer.

9. The controller of claim 1 further comprising a controller interface I/O port in the controller for coupling the controller to a controller interface.

10. The controller of claim 9 further comprising the controller interface for coupling the controller to the selected electroluminescent device system.

11. The controller of claim 10 further comprising the selected electroluminescent device system.

12. The controller of claim 11 further comprising a single circuit board for mounting the controller and the selected electroluminescent device system.

13. The controller of claim 1 further comprising the application program module.

14. The controller of claim 13 further comprising a function in the application program module for one of initializing the electroluminescent device system, detecting a laser overload, and finding a laser threshold.

15. The controller of claim 14 further comprising in the function for initializing the electroluminescent device system a function for automatic eye safety shutdown in response to an interrupt received from the controller interface.

16. The controller of claim 1 further comprising an application program module for finding a laser threshold as an intersection point of a first line equation for a low slope group of recorded data points and a second line equation for a high slope group of recorded data points.

17. A computer program product comprising:
   a medium for embodying a computer program for input to a computer; and
   a computer program embodied in the medium for causing the computer to perform steps of:
   receiving as input configuration data for an electroluminescent device system selected from an internal electroluminescent device system configuration database stored ma controller for multiple electroluminescent device systems;
   selecting an application program module stored in the controller as a function of the configuration data for the selected electroluminescent device system;
   performing a function of the configuration data for the selected electroluminescent device system in the application program module;
   communicating information between a user and the controller via a graphical user interface in a host computer; and
   disconnecting the controller from the host computer and performing a function of the configuration data for the selected electroluminescent device system independently from the host computer.

18. The computer program product of claim 17 further comprising downloading the application program module from the host computer into an application program module memory in the controller.

19. The computer program product of claim 18 further comprising storing output from the application program module in a common data memory in the controller outside the application program module memory.

20. The computer program product of claim 19 further comprising sending the output from the application program module to the host computer.

21. The computer program product of claim 17 further comprising performing a function of the configuration data for one of initializing the electroluminescent device system, detecting a laser overload and finding a laser threshold.

22. The computer program product of claim 21 further comprising in the function for initializing the selected electroluminescent device system a function for automatic eye safety shutdown in response to an interrupt received from the selected electroluminescent device system.

23. The computer program product of claim 17 further comprising performing a function of the configuration data for finding a laser threshold as an intersection point of a first line equation for a low slope group of recorded data points and a second line equation for a high slope group of recorded data points.

24. A computer program product comprising:
a medium for embodying a computer program for input to a computer; and
a computer program embodied in the medium for causing the computer to perform steps of:
receiving as input configuration data for an electroluminescent device system selected from an internal electroluminescent device system configuration database stored in a controller for multiple electroluminescent device systems;
selecting an application program module stored in the controller as a function of the configuration data for the selected electroluminescent device system;
performing a function of the configuration data for the selected electroluminescent device system in the application module; and
communicating information between a user and the controller via a graphical user interface in a host computer.

25. The computer program product of claim 24 further comprising disconnecting the controller from the host computer and performing function of the configuration data for the selected electroluminescent device system independently from the host computer.

* * * * *